(12) United States Patent
Eom

(10) Patent No.: US 8,623,772 B2
(45) Date of Patent: Jan. 7, 2014

(54) METHOD OF FORMING PATTERNS OF SEMICONDUCTOR DEVICE

(75) Inventor: Jae Doo Eom, Suwon-si (KR)

(73) Assignee: SK Hynix Inc., Icheon-Si (KR)

(*) Notice: Subject to any disclaimer, the term of this patent is extended or adjusted under 35 U.S.C. 154(b) by 675 days.

(21) Appl. No.: 12/493,823

(22) Filed: Jun. 29, 2009

(65) Prior Publication Data

US 2010/0184287 A1  Jul. 22, 2010

(30) Foreign Application Priority Data

Jan. 22, 2009  (KR) .................. 10-2009-0005418

(51) Int. Cl.
  *H01L 21/302*  (2006.01)
  *H01L 21/461*  (2006.01)
(52) U.S. Cl.
  USPC ............... 438/736; 438/11; 438/18; 257/48; 257/524; 257/E21.524; 257/E23.179
(58) Field of Classification Search
  USPC ............. 438/11, 18, 736; 257/48, E23.179, 257/E21.524
  See application file for complete search history.

(56) References Cited

U.S. PATENT DOCUMENTS

| 7,268,054 B2 | 9/2007 | Tran et al. |
| 7,351,666 B2 * | 4/2008 | Furukawa et al. ............ 438/736 |
| 2008/0280217 A1 * | 11/2008 | Liu ................................. 430/5 |
| 2009/0269924 A1 * | 10/2009 | Choi et al. .................... 438/669 |

FOREIGN PATENT DOCUMENTS

| KR | 10-0231134 | 8/1999 |
| KR | 10-2006-0113162 | 11/2006 |
| KR | 10-2007-0058578 | 6/2007 |

OTHER PUBLICATIONS

Hoggan et al., "Dry Lithography Using Liquid and Supercritical Carbon Dioxide Based Chemistries and Processes" 2004 IEEE, Transactions on Semiconductor Manufacturing, vol. 17, No. 4, pp. 510-516.*

* cited by examiner

*Primary Examiner* — Leonard Chang
(74) *Attorney, Agent, or Firm* — Marshall, Gerstein & Borun LLP; James P. Zeller

(57) ABSTRACT

A method of forming patterns of a semiconductor device includes forming a hard mask layer and a first sacrificial layer over a first region and a second region of a semiconductor substrate, etching the first sacrificial layer to form a first sacrificial pattern having a first width in the first region and second sacrificial patterns having a second width in the second region, wherein the second width is narrower than the first width, forming a first spacer surrounding sidewalls of the first sacrificial pattern and a second spacer surrounding sidewalls of the second sacrificial patterns, removing the first and the second sacrificial patterns; and etching the first and second spacers.

14 Claims, 19 Drawing Sheets

TEST PATTERN REGION | CELL ARRAY REGION

METHOD OF FORMING PATTERNS OF SEMICONDUCTOR DEVICE

CROSS-REFERENCE TO RELATED APPLICATION

Priority to Korean patent application number 10-2009-0005418 filed on Jan. 22, 2009, the entire disclosure of which is incorporated by reference herein, is claimed.

BACKGROUND

1. Field of the Invention

This invention generally relates to a method of forming patterns of a semiconductor device and, more particularly, to a method of forming the patterns of a semiconductor device, which is capable of stabilizing a pattern formation process and securing process margin, although spacer patterning technology is used.

2. Brief Description of Related Technology

The patterns of a semiconductor device include cell patterns, which constitute the cell array of the semiconductor device, and test patterns formed under the same conditions (for example, material, thickness, width, and length) as the cell patterns to analyze the resistance of the cell patterns. The cell patterns are formed in a cell array region, and the test patterns are formed in a peripheral (peri) region that is narrower than the cell array region. The patterns of the semiconductor device become micro-sized with a high degree of integration of the semiconductor device.

Spacer patterning technology has been proposed as a method of forming the micro patterns of the semiconductor device. Spacer patterning technology includes a process of patterning an sacrificial pattern using a photoresist pattern as an etch barrier, a process of forming a spacer on the sidewalls of the sacrificial pattern, a process of removing the sacrificial pattern, a process of patterning a hard mask pattern using the spacer as an etch barrier, and a process of patterning the patterns of a semiconductor device using the hard mask pattern as an etch barrier. As described above, in spacer patterning technology, the shapes of the hard mask pattern and the cell patterns are defined by the spacer.

The above-described spacer is configured to surround the sidewalls of the sacrificial pattern having a specific width. More specifically, the spacer includes line spacers spaced apart from each other at a specific interval and interconnection spacers connecting both ends of the line spacers and formed at the sidewalls of both ends of the sacrificial pattern. Here, the interconnection spacers are removed before the hard mask pattern is formed. Accordingly, the shapes of the test patterns and the cell patterns are defined by the line spacers. On the other hand, pad units are formed at both ends of the test patterns and each has a width wider than that of the test patterns and functions as resistance measurement terminals. To this end, after the interconnection spacers are removed, a pad sacrificial pattern, having a width wider than the width of each of the line spacers, must be formed at both ends of the line spacer. In this case, since the interval between the line spacers formed in the peri region is narrow as in the cell array region, the pad sacrificial pattern does not overlap both ends of one line spacer, but connects two line spacers and overlaps therewith. The hard mask pattern is patterned using the pad sacrificial pattern and the line spacers having this form. The cell patterns, the test patterns, and the pad units are patterned using the hard mask pattern. Consequently, the test patterns have the same width and interval as the cell patterns. The pad units are configured to connect two test patterns and are formed at both ends of the test patterns. The resistance value of the cell pattern is analyzed through the test patterns and the pad units. To analyze the resistance value of the cell patterns, the resistance value of one of the test patterns formed under the same condition as the cell patterns must be known. However, since the pad units are formed to connect the two test patterns, the resistance value measured through the pad units to analyze the resistance value of the cell patterns must be divided in half.

On the other hand, to accurately analyze the resistance of the cell patterns, the test patterns must be formed under the same conditions as the cell patterns. If it is sought to form the test patterns under the same conditions as the cell patterns, the sizes of the photoresist patterns, functioning as the etch barriers, must be identical in the cell array region and the peri region when the sacrificial patterns are formed. In the case where the photoresist patterns having the same size are formed in the peri region and the cell array region, the densities of the photoresist patterns in the peri region and the cell array region must be uniform because of Depth of Focus (DOF) margin. Accordingly, dummy photoresist patterns are formed in the peri region. Through the dummy photoresist patterns, dummy sacrificial patterns are formed when the sacrificial patterns are formed, dummy spacers are formed when the spacers are formed, the dummy hard mask pattern is formed when the hard mask pattern is formed, and dummy patterns are formed when the cell patterns and the test patterns are formed. The dummy patterns are formed in a process of improving the stability of a process, but are not used to analyze the resistance of the cell patterns. Accordingly, the dummy patterns must be electrically isolated from the test patterns. However, if the width of the pad units formed at both ends of the test pattern is wider than the width of the test pattern, there is a danger that the dummy patterns might be connected to the pad units. To prevent this problem, the length of the dummy patterns is shorter than that of the test pattern. If it is sought to form the length of the dummy pattern shorter than that of the test pattern as described above, the length of the dummy sacrificial patterns must be shorter than that of other sacrificial patterns.

FIG. 1 is a diagram showing spacers formed by known methods.

Referring to FIG. 1, spacers include a first spacer 1 formed to define a test pattern, dummy spacers 3 formed for the stability of a process, and a second spacer 5 formed to define cell patterns. As described above, the first spacer 1 has the same shape as the second spacer 5, and the dummy spacers 3 are shorter than the first spacer 1. The spacers 1, 3, and 5 are divided into respective line spacers 1a, 3a, and 5a and respective interconnection spacers 1b, 3b, and 5b. Here, since regions where the test pattern, the dummy patterns, and the cell patterns will be formed are defined by the respective line spacers 1a, 3a, and 5a, the interconnection spacers 1b, 3b, and 5b must be removed.

The interconnection spacers 1b, 3b, and 5b are removed by an etch process using photoresist patterns PR as etch barriers. Regions where the photoresist patterns PR will be formed are defined depending on exposure mask alignment. In this case, since the dummy spacers 3 are shorter than the first spacer 1, the interconnection spacers 3b of the dummy spacers 3 and the interconnection spacer 1b of the first spacer 1 are not arranged on the same line. It makes it difficult to secure the alignment margin of an exposure mask in the test pattern region. Accordingly, the line spacer 1a of the first spacer 1 adjacent to the interconnection spacers 3b of the dummy spacers 3 is likely to be exposed as in a portion indicated by "X." Consequently, failure is generated in the formation of the test pattern. Accordingly, there is a need for a method of stabilizing a pattern formation process and securing process margin, although spacer patterning technology is used.

BRIEF SUMMARY

Disclosed herein is a method of forming the patterns of a semiconductor device, which is capable of stabilizing a pattern formation process and also securing process margin, although spacer patterning technology is used.

First and second embodiments are directed to a method of forming patterns of a semiconductor device. The method includes stacking a hard mask layer and a first sacrificial layerover first and second regions of a semiconductor substrate, and etching the first sacrificial layerto form a first sacrificial pattern having a first width in the first region and to form cell sacrificial patterns in the second region, each pattern having a second width narrower than the first width. The method also includes forming a first spacer surrounding sidewalls of the first sacrificial pattern and a second spacer surrounding sidewalls of each of the cell sacrificial patterns, removing the first sacrificial pattern and the cell sacrificial patternpatterns, and etching the first and second spacers. The first spacer preferably includes first line spacers spaced apart from each other at the first width, and first interconnection spacers configured to connect both ends of the first line spacers. The second spacer preferably includes second line spacers spaced apart from each other at the second width, and second interconnection spacers configured to connect both ends of the second line spacers.

According to a first embodiment, in the etching of the first and second spacers, the second interconnection spacers and a first line spacer connected to one end of the first interconnection spacers preferably are removed.

According to a second embodiment, in the etching of the first and second spacers, the first interconnection spacers and the second interconnection spacers preferably are removed, so the first and second line spacers are separated from each other.

A third embodiment is directed to a method of forming patterns of a semiconductor device. The method includes stacking a hard mask layer and a first sacrificial layerover first and second regions of a semiconductor substrate. The method also includes etching the first sacrificial layerto form a first sacrificial pattern, and cell sacrificial patterns. The first sacrificial pattern includes a first pattern having a first width in the first region and second patterns each having a second width. Each of the cell sacrificial patterns has a third width narrower than the first width in the second region. The second patterns protrude from one end of the first pattern and are formed in paralle. The method further includes forming the first spacer surrounding sidewalls of the first sacrificial pattern and a second spacer surrounding sidewalls of the cell sacrificial patternpatterns, removing the first sacrificial pattern and the cell sacrificial patternpatterns, and removing the first spacer formed on a side of the first pattern and the second spacer formed on sidewalls of both ends of the cell sacrificial patternpatterns.

According to a fourth embodiment, during the formation of the first sacrificial pattern and the cell sacrificial patterns, a third sacrificial pattern, having third and fourth patterns, is formed in the first region. The third pattern faces the first pattern in a state where the second patterns intervene between the third pattern and the first pattern. The fourth patterns are configured to protrude from one end of the third pattern and are placed between the second patterns.

BRIEF DESCRIPTION OF THE DRAWINGS

For a more complete understanding of the disclosure, reference should be made to the following detailed description and accompanying drawings, wherein.

Figure 1:
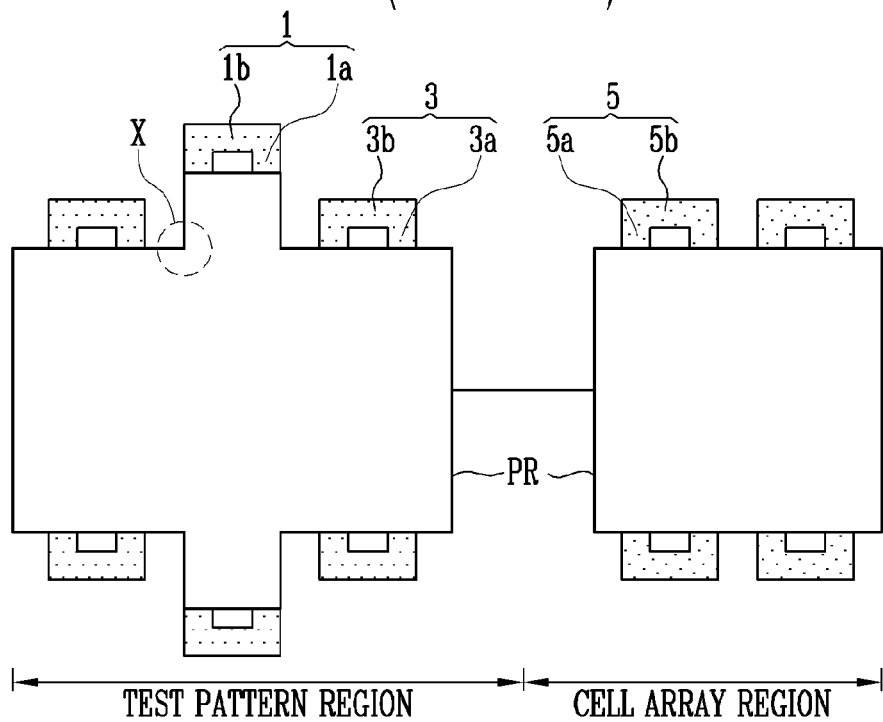
FIG. 1 is a diagram showing spacers formed by a known method.

While the disclosed method is susceptible of embodiments in various forms, specific embodiments are illustrated in the drawings (and will hereafter be described) with the understanding that the disclosure is not intended to limit the invention to the specific embodiment described and illustrated herein.

DESCRIPTION OF SPECIFIC EMBODIMENTS

Disclosed herein are methods described in detail with reference to the accompanying drawings. The drawing figures are provided to allow those having ordinary skill in the art to understand the scope of one or more embodiments of the disclosure. To clarify multiple layers and regions, the thickness of the layers is enlarged in the drawings.

FIGS. 2A to 2J are plan views showing a method of forming patterns of a semiconductor device according to a first embodiment, and FIGS. 3A to 3J are section views of the semiconductor device taken along line I-I' shown in FIGS. 2A to 2J.

Figure 2A:
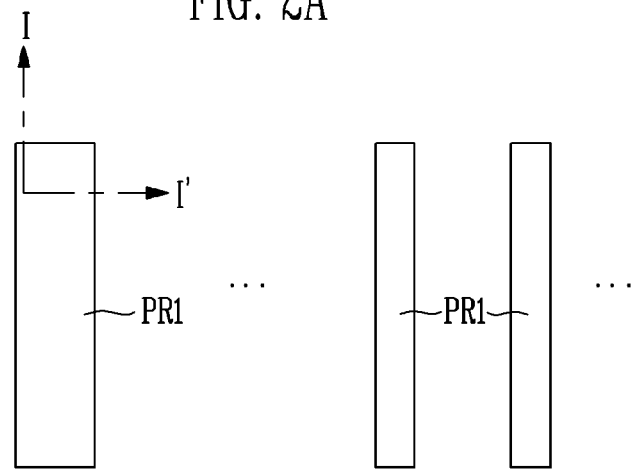
FIGS. 2A to 2J are plan views showing a method of forming patterns of a semiconductor device (top layer) according to a first embodiment.
Figure 3A:
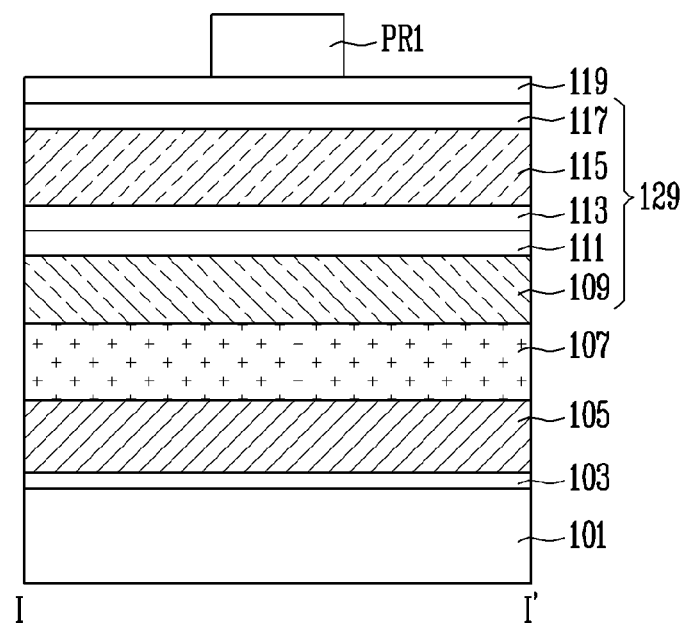
FIGS. 3A to 3J are section views of the semiconductor device taken along line I-I' shown in FIGS. 2A to 2J.

Referring to FIGS. 2A and 3A, a target etch layer 105, a hard mask layer 107, a first auxiliary layer, 129, and first photoresist patterns PR1 for forming the patterns of the semiconductor device are formed over a semiconductor substrate 101 including a first region A and a second region B (semiconductor substrate in second region B is not shown).

The first region A is a peri region where a test pattern and test pad units will be formed. The second region B is a cell array region where cell array patterns constituting the cell array of the semiconductor device will be formed.

The target etch layer 105 is patterned to form the target pattern, which constitutes the test pattern, the test pad units, and the cell array pattern. For example, when the cell array patterns are gate patterns, the target etch layer 105 is formed from a conduction layer for gate patterns. Furthermore, when the target etch layer 105 is a conduction layer for gate patterns, the target etch layer 105 may be formed over a gate insulation layer 103 formed on the semiconductor substrate 101.

The first sacrificial layer 129 is formed by stacking materials having different etch properties from the etch property of the hard mask layer 107 and etch steps, performed during a spacer patterning process, taken into consideration so that the materials come into contact with each other.

In more detail, the hard mask layer 107 may be made of Tetra Ethyl Ortho Silicate (TEOS). The first sacrificial layer 129 may have a structure in which a first amorphous carbon layer 109, a first SiON layer 111, a polysilicon layer 113, a second amorphous carbon layer 115, and a second SiON layer 117 are sequentially stacked. Here, before the first photoresist patterns PR1 are formed, a Bottom Anti-Reflect Coating (BARC) layer 119 may be further formed over the first auxiliary layer 129. The BARC layer 119 functions to prevent the scattering of a light source when the exposure process of forming the first photoresist patterns PR1 is performed.

The width of the first photoresist pattern PR1 formed in the first region A becomes a factor to determine the alignment margin of an exposure mask for cutting in a subsequent process. Accordingly, to secure the alignment margin of the exposure mask for cutting in the first region A, the first photoresist patterns PR1 have different widths in the first region A and the second region B. In more detail, the width of the first photoresist pattern PR1 formed in the first region A may be wider than the width of the first photoresist pattern PR1 formed in the second region B. In this case, although the width of the first photoresist pattern PR1 formed in the first region A may vary depending on the design rule of a semiconductor device, the width of the first photoresist pattern PR1 formed in the first region A may be six times greater than the width of the first photoresist pattern PR1 formed in the second region B to secure Depth Of Focus (DOF) margin. Furthermore, the width of the first photoresist pattern PR1 formed in the first region A may be eight times smaller than the width of the first photoresist pattern PR1 formed in the second region B so that the first photoresist pattern PR1 can be formed within the first region A.

When the width of the first photoresist pattern PR1 formed in the first region A is six times greater than the width of the first photoresist pattern PR1 formed in the second region B as described above, DOF margin can be secured. Accordingly, a dummy photoresist pattern can be removed in the first region A because it is not necessary to make the density of the first photoresist patterns PR1 identical in the first region A and the second region B.

Figure 2B:
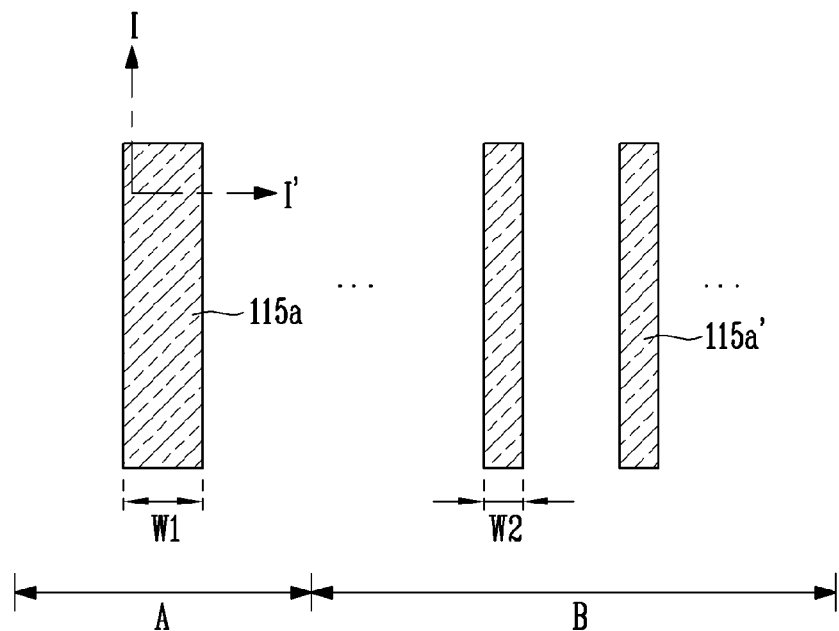
Figure 3B:
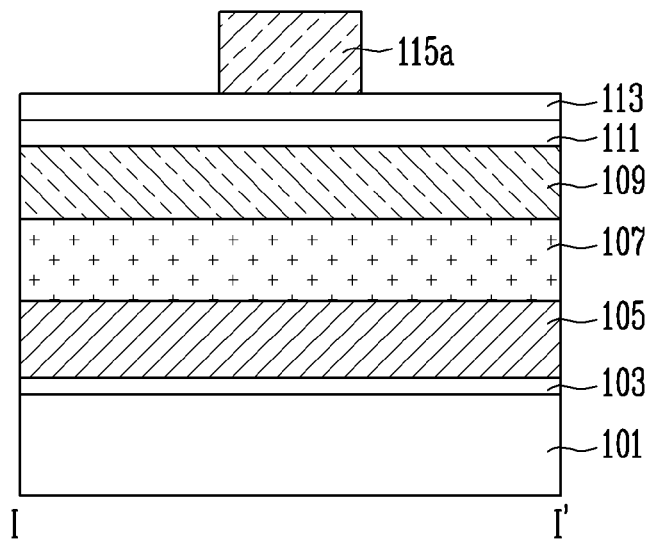

Referring to FIGS. 2B and 3B, the BARC layer 119, the second SiON layer 117, and the second amorphous carbon layer 115 are sequentially etched using the first photoresist patterns PR1, shown in FIGS. 2A and 3A, as etch barriers, thereby forming a first sacrificial pattern 115a and cell sacrificial patterns 115a' over the polysilicon layer 113.

The width of the first sacrificial pattern 115a and each of the cell sacrificial patternpatterns 115a' are defined by the width of the first photoresist pattern PR1. The width of the first photoresist pattern PR1 formed in the first region A is wider than the width of the first photoresist pattern PR1 formed in the second region B. Accordingly, the first width W1 of the first sacrificial pattern 115a is wider than the second width W2 of the cell sacrificial patternpatterns 115a'. Here, the first width W1 may be six to eight times the second width W2.

When the etch process of forming the first sacrificial pattern 115a and the cell sacrificial patterns 115a' is performed, the polysilicon layer 113 is made of material having an etch rate which is slower than that of the second amorphous carbon layer 115, thus functioning as an etch-stop layer. Furthermore, when the etch process of forming the first sacrificial pattern 115a and the cell sacrificial patterns 115a' is performed, the first photoresist patterns PR1, the BARC layer 119, the second SiON layer 117, etc. may be removed. Alternatively, after the first sacrificial pattern 115a and the cell sacrificial patterns 115a' are formed, the first photoresist patterns PR1, the BARC layer 119, and the second SiON layer 117, which are left over, may be removed using an additional process.

Figure 2C:
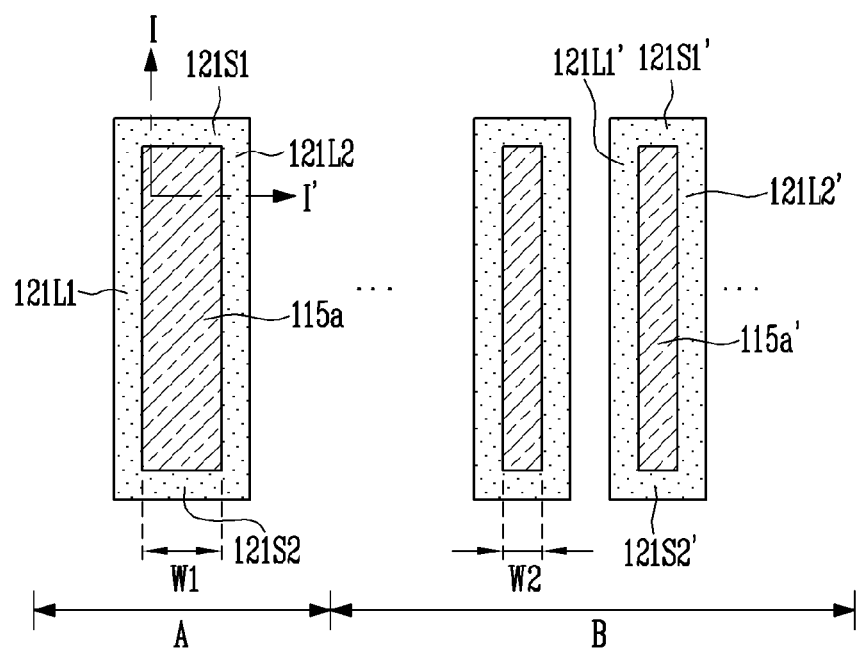
Figure 3C:
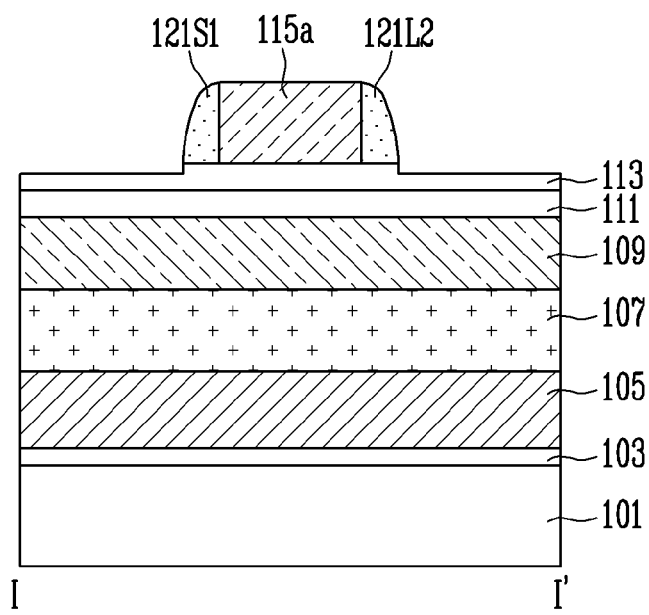

Referring to FIGS. 2C and 3C, a first spacer configured to surround the sidewalls of the first sacrificial pattern 115a and a second spacer configured to surround the sidewalls of the cell sacrificial patterns 115a' are formed.

The first spacer includes first line spacers 121L1 and 121L2 and first interconnection spacers 121S1 and 121S2. The first line spacers 121L1 and 121L2 are spaced apart from each other at the first width W1. The first interconnection spacers 121S1 and 121S2 are configured to connect both ends of the first line spacers 121L1 and 121L2 and are formed on both sidewalls of the first sacrificial pattern 115a.

The second spacer includes second line spacers 121L1' and 121L2' and second interconnection spacers 121S1' and 121S2'. The second line spacers 121L1' and 121L2' are spaced apart from each other at the second width W2. The second interconnection spacers 121S1' and 121S2' are configured to connect both ends of the second line spacers 121L1' and 121L2' and are formed on both sidewalls of each of the cell sacrificial patterns 115a'.

The first and second spacers are formed by etching a spacer layer formed on the surface of the polysilicon layer 113, including the first sacrificial pattern 115a and the cell sacrificial patterns 115a', through blank-etching or partial etching so that the spacer layer remains on the sidewalls of the first sacrificial pattern 115a and the cell sacrificial patterns 115a'. In this case, a part of the polysilicon layer 113 exposed at the portion from which the spacer layer has been removed may be etched.

Figure 2D:
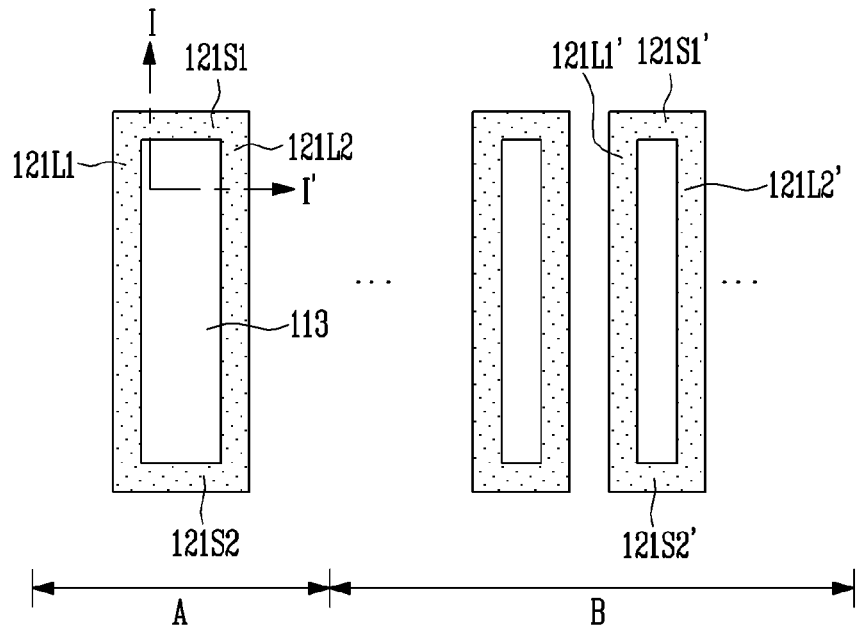
Figure 3D:
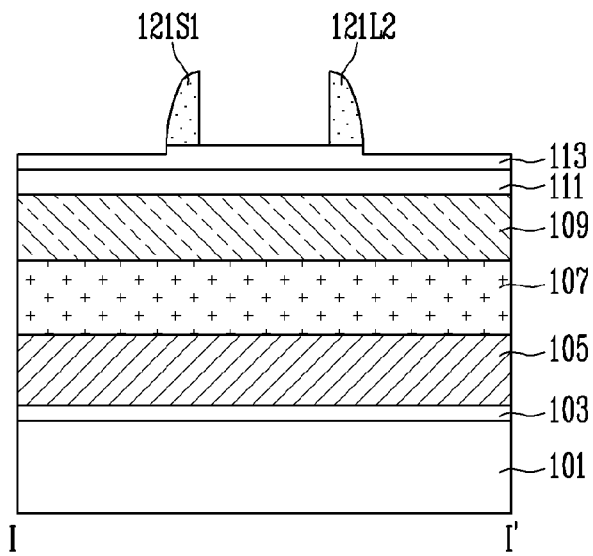

Referring to FIGS. 2D and 3D, the first sacrificial pattern 115a and the cell sacrificial patterns 115a' shown in FIGS. 2C and 3C are removed, so the polysilicon layer 113 under the first sacrificial pattern 115a and the cell sacrificial patterns 115a' is exposed.

Figure 2E:
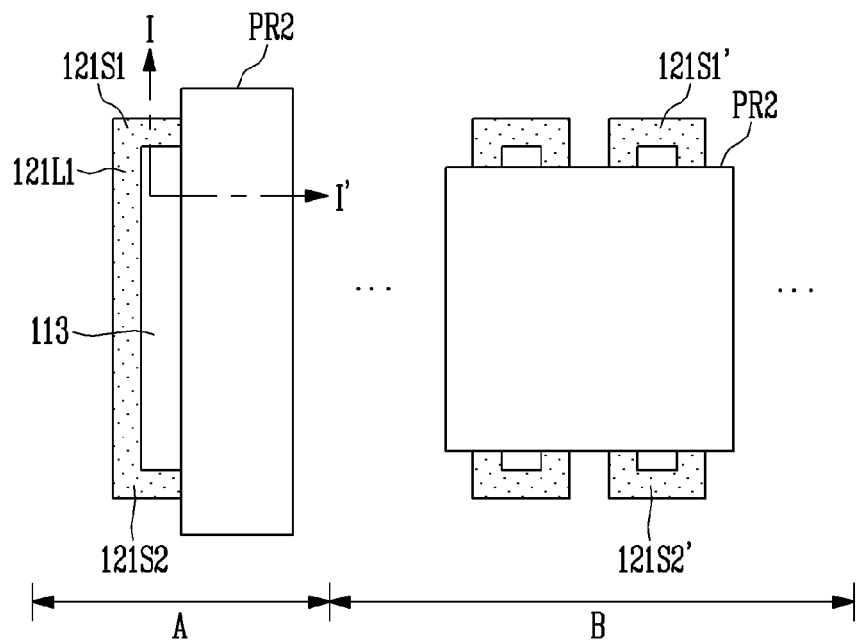
Figure 3E:
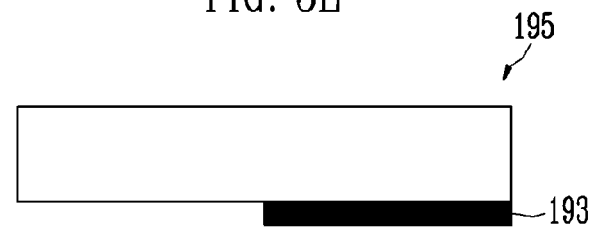
Figure 3E:
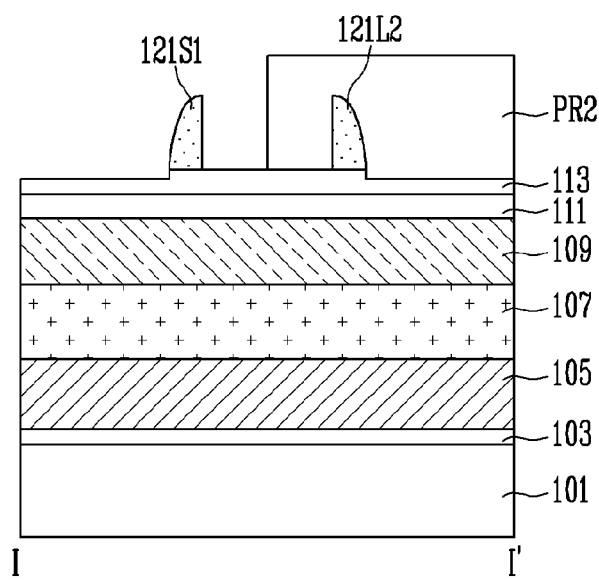

Referring to FIGS. 2E and 3E, second photoresist patterns PR2 are formed to remove the first line spacers 121L1, connected to one end of the first interconnection spacers 121S1 and 121S2, and the second interconnection spacers 121S1' and 121S2'.

The second photoresist patterns PR2 are formed so that the first line spacers 121L1, connected to one end of the first interconnection spacers 121S1 and 121S2, and the second interconnection spacers 121S1' and 121S2' are exposed.

A method of forming the second photoresist patterns PR2 is described in more detail below. First, a photoresist layer is coated over the polysilicon layer 113 including the first and second spacers. An exposure mask 195 for cutting, including a light-blocking pattern 193, is formed over the photoresist layer. The light-blocking pattern 193 of the exposure mask 195 for cutting is transferred to the photoresist layer by performing an exposure process. After the exposure process, the photoresist layer is developed, so the second photoresist patterns PR2 are formed over the polysilicon layer 113.

The light-blocking pattern 193 of the exposure mask 195 for cutting is made of light-blocking material, such as chrome (Cr), thus being capable of blocking light during an exposure process. Since the formation regions of the second photoresist patterns PR2 are defined depending on the alignment of the light-blocking pattern 193, the alignment margin of the light-blocking pattern 193 in the first region A and the second region B must be sufficient. In general, the interval between the second interconnection spacers 121S1' and 121S2' may provide sufficient process margin. On the other hand, in the first region A, the interval between the first line spacers 121L1 and 121L2 is defined by the first width, and the interval between the second line spacers 121L1' and 121L2' is defined by the second width. The first width is wider than the second width. Accordingly, the alignment margin of the light-blocking pattern 193, configured to shield the first line spacer 121L2 connected to one end of the first interconnection spacers 121S1 and 121S2, and expose the first line spacer 121L1 connected to the other ends of the first interconnection spacers 121S1 and 121S2 in the first region A, is sufficient.

Figure 2F:
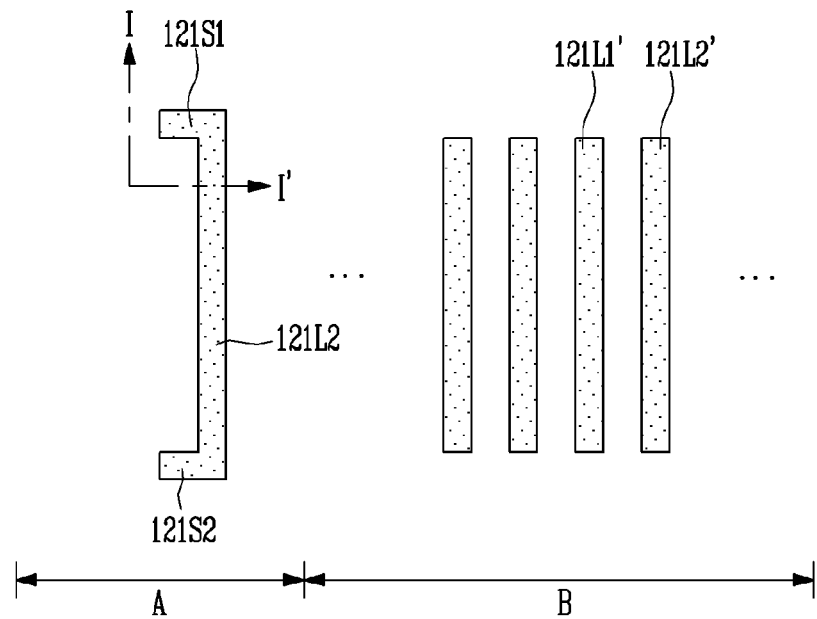
Figure 3F:
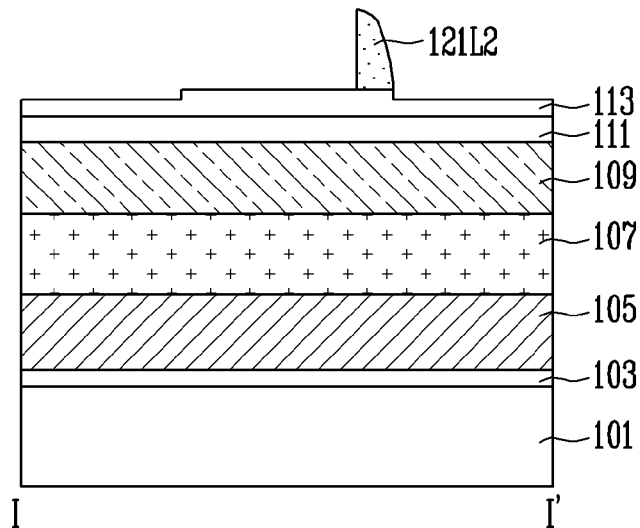

Referring to FIGS. 2F and 3F, the first line spacers 121L1, connected to one end of the first interconnection spacers 121S1 and 121S2, and the second interconnection spacers 121S1' and 121S2' are removed using the second photoresist patterns PR2, shown in FIGS. 2E and 3E, as etch barriers. The second photoresist patterns PR2 are then removed.

Figure 2G:
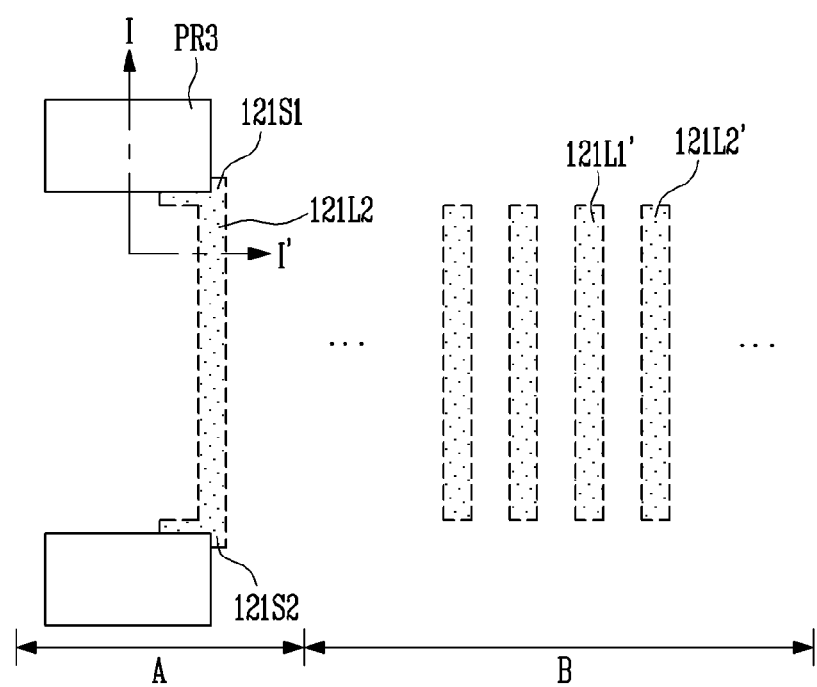
Figure 3G:
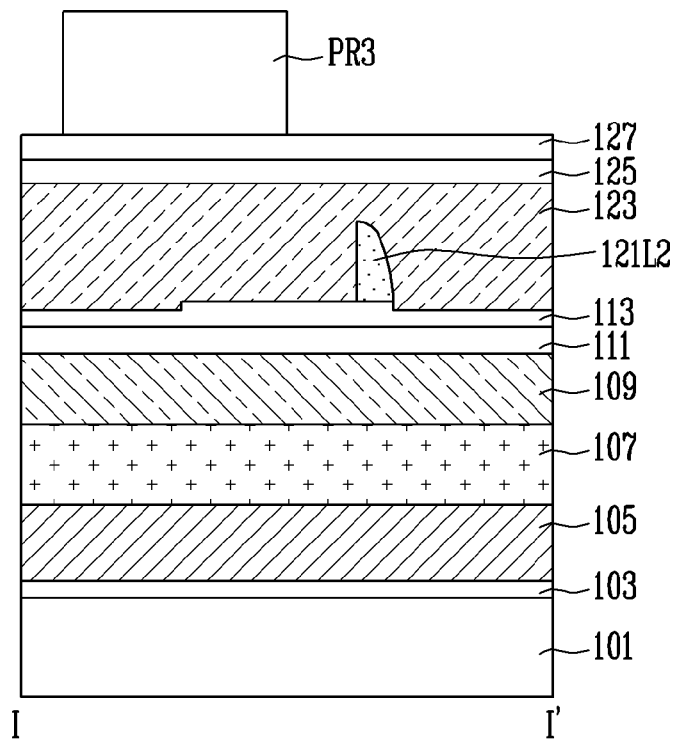

Referring to FIGS. 2G and 3G, a Spin On Carbon (SOC) layer 123, a Multi-Functional Hard Mask (MFHM) layer 125, and third photoresist patterns PR3 are stacked over the polysilicon layer 113 so that the first spacer and the second spacer that are left over are covered.

The SOC layer 123 and the MFHM layer 125 are made of materials having a different etch property. Before the third photoresist patterns PR3 are formed, an interlayer layer 127, such as a BARC layer, may be further formed over the MFHM layer 125. The interlayer layer 127 functions to prevent the scattering of a light source when an exposure process of forming the third photoresist patterns PR3 is performed.

Each of the third photoresist patterns PR3 has a pattern defining test pad units. The test pad units function as terminals for measuring the resistance of the test pattern. The test pad units each have a width wider than that of the test pattern and are formed at both ends of the test pattern. In the case where spacer patterning technology is used, the widths of the first line spacer 121L2 and the second line spacers 121L1' and 121L2', defining the regions where the test pattern and the cell patterns will be respectively formed, become uniform. Accordingly, to form the test pad units each having a width wider than that of the test pattern, a process of forming the third photoresist patterns PR3 has to be additionally performed. The third photoresist patterns PR3 are formed at both ends of the remaining first spacer so that they overlap each other.

Figure 2H:
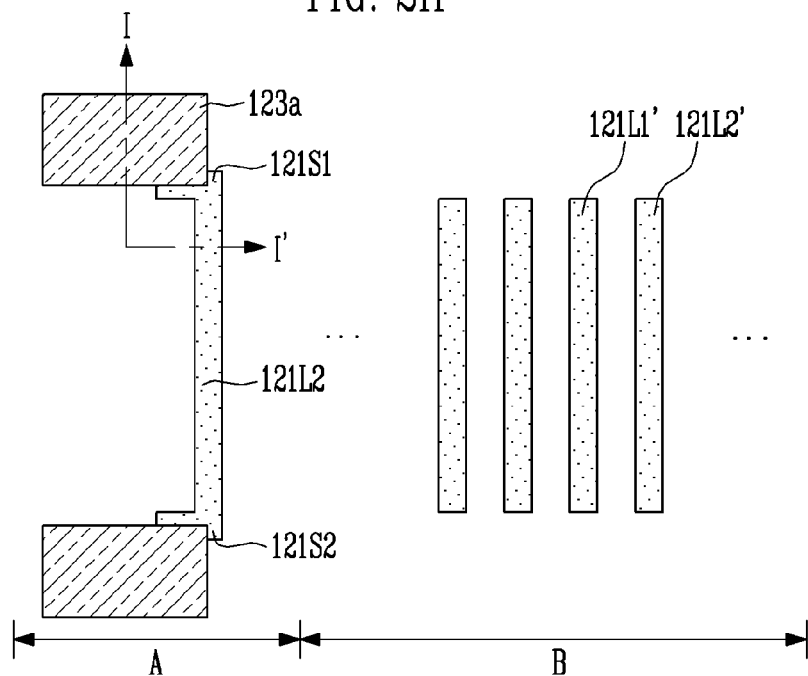
Figure 3H:
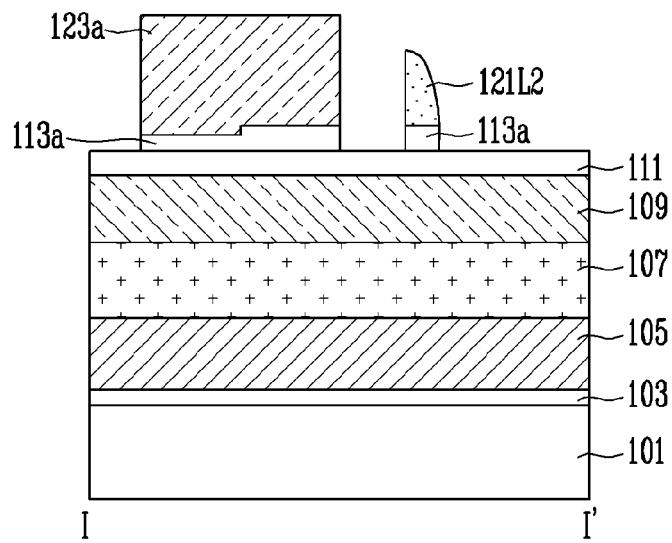

Referring to FIGS. 2H and 3H, the interlayer layer 127, the MFHM layer 125, the SOC layer 123, and the polysilicon layer 113 are sequentially etched using the third photoresist patterns PR3, shown in FIGS. 2G and 3G, as etch barriers. Accordingly, second sacrificial patterns 123a and polysilicon patterns 113a are formed.

Each of the second sacrificial patterns 123a has a width wider than that of the remaining first spacer and overlaps both ends of the first spacer.

The polysilicon patterns 113a are formed under the second sacrificial patterns 123a and the remaining first and second spacers.

When an etch process of forming the second sacrificial patterns 123a and the polysilicon patterns 113a is performed, the first SiON layer 111, made of material slowly etched as compared to the polysilicon layer 113, functions as an etch stop layer. Furthermore, when the etch process of forming the second sacrificial patterns 123a and the polysilicon patterns 113a is performed, the third photoresist patterns PR3, the interlayer layer 127, and the MFHM layer 125 may be removed. Alternatively, after the second sacrificial patterns 123a and the polysilicon patterns 113a are formed, the third photoresist patterns PR3, the interlayer layer 127, and the MFHM layer 125 that are left over may be removed using an additional process.

Figure 2I:
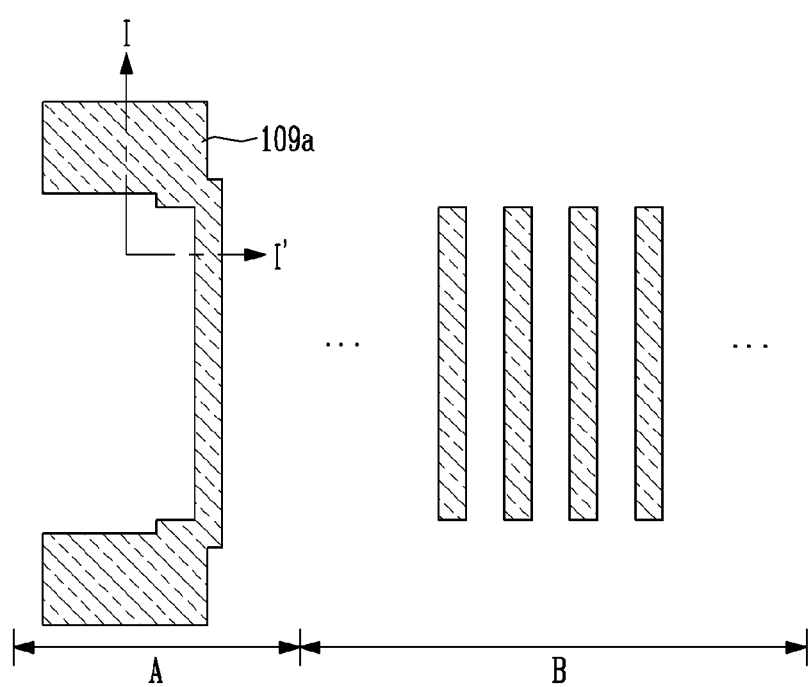
Figure 3I:
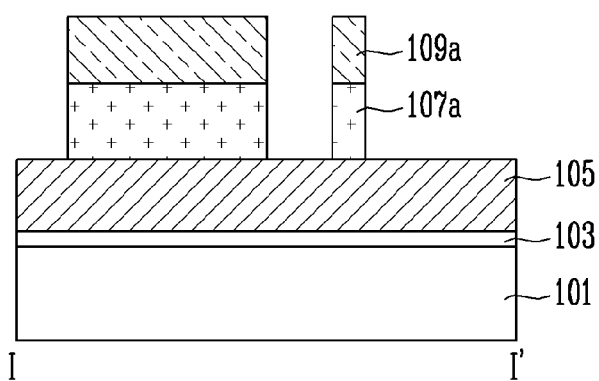

Referring to FIGS. 2I and 3I, the first SiON layer 111, the first amorphous carbon layer 109, and the hard mask layer 107 are sequentially etched using the second sacrificial patterns 123a, shown in FIGS. 2H and 3H, the remaining first and second spacers, and the polysilicon patterns 113a as etch barriers. While the first SiON layer 111 and the first amorphous carbon layer 109 are etched, the first and second spacers and the second sacrificial patterns 123a may be removed. Furthermore, while the hard mask layer 107 is etched, the polysilicon patterns 113a and the first SiON layer 111 may be removed. Consequently, stack patterns in which of which a hard mask pattern 107a and a first amorphous carbon pattern 109a are stacked are formed over the target etch layer 105.

Figure 2J:
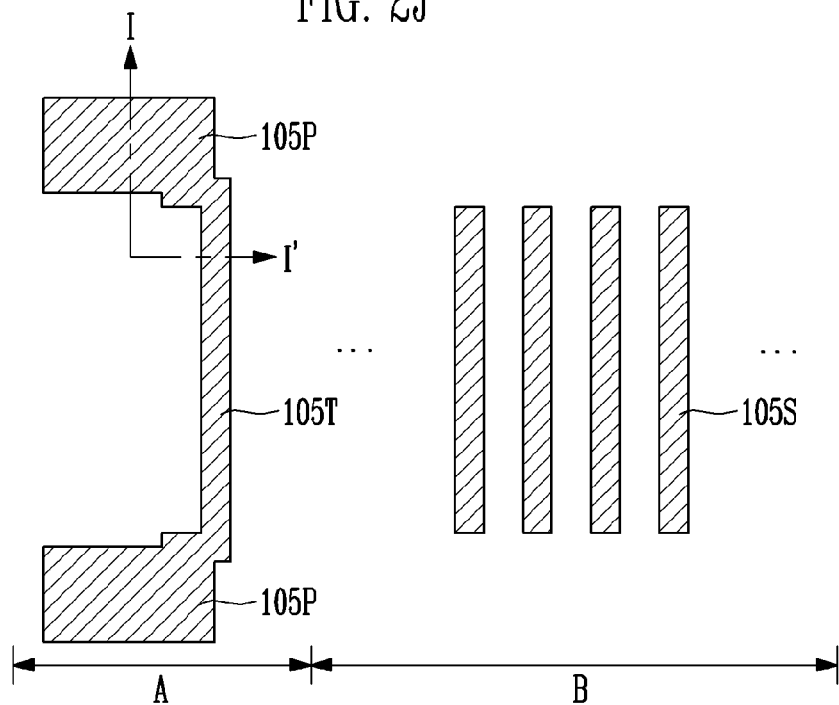
Figure 3J:
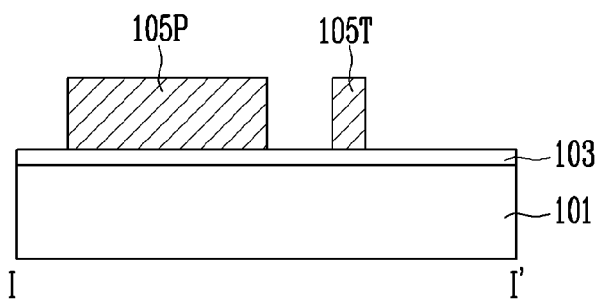

Referring to FIGS. 2J and 3J, the target etch layer 105 is etched using the first amorphous carbon pattern 109a and the hard mask pattern 107a, shown in FIGS. 2I and 3I, as etch barriers, thereby forming cell patterns 105S, a test pattern 105T, and test pad units 105P over the semiconductor substrate 101. When the etch process of forming the cell patterns 105S, the test pattern 105T, and the test pad units 105P is performed, the first amorphous carbon pattern 109a and the hard mask pattern 107a may be removed. Alternatively, after the cell patterns 105S, the test pattern 105T, and the test pad units 105P are formed, the first amorphous carbon pattern 109a and the hard mask pattern 107a may be removed using an additional process.

The test pattern 105T according to the first embodiment is formed in a single-line form in the first region A through a series of the processes. Accordingly, the resistance of the cell patterns 105S having a single-line form can be directly analyzed by applying an electrical signal to the test pad units 105P and then measuring the resistance of the test pattern 105T having a single-line form. That is, the resistance of the cell patterns can be analyzed without additional conversion. This is because the alignment margin of the exposure mask 195 for cutting, described with reference to FIGS. 2E and 3E, can be secured by forming the width of the first photoresist pattern PR1, formed in the first region A, to be wider than the width of each of the first photoresist patterns PR1, formed in the second region B, as described with reference to FIGS. 2A and 3A. Here, the target pattern formed in the first region is a resistance test pattern.

FIGS. 4A to 4D are plan views showing a method of forming patterns of a semiconductor device according to a second embodiment. The second embodiment shown in FIGS. 4A to 4D is identical to the first embodiment shown in FIGS. 2A to 2J except for a first spacer remaining in a first region A after the first and second spacers are etched. Accordingly, a second region where cell patterns are formed is identical to the second region shown in FIGS. 2A to 2J, and a description thereof is omitted. In addition, in the second embodiment, the test pattern and test pad units formed in the first region are formed using the same stack structure as that shown in FIGS. 3A to 3J. Accordingly, sectional views showing the stack structure are not shown and a description of the stack structure is omitted.

First, in the second embodiment, the first spacer is formed using the same method as that shown in FIGS. 2A and 3A, 2B and 3B, 2C and 3C, and 2D and 3D.

Figure 4A:
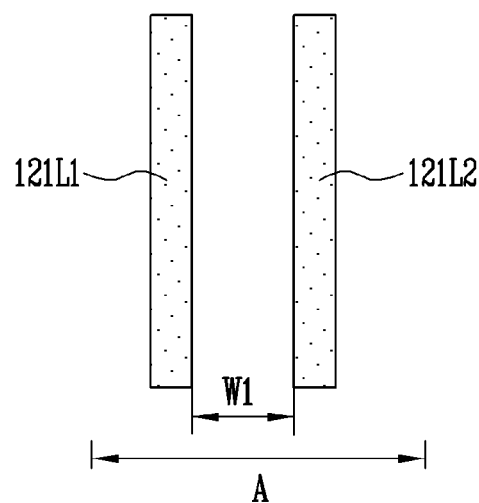
FIGS. 4A to 4D are plan views showing a method of forming patterns of a semiconductor device (top layer) according to a second embodiment.

Referring to FIG. 4A, in the second embodiment, the first interconnection spacers are exposed. The first spacer is etched using photoresist patterns, which cover the first line spacers 121L1 and 121L2, as etch barriers. Accordingly, the first interconnection spacers are removed, but the first line spacers 121L1 and 121L2 remain in the first region A.

Figure 4B:
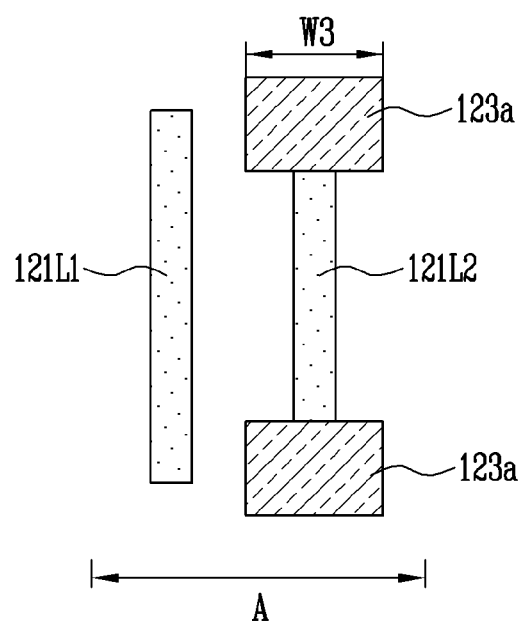

Referring to FIG. 4B, second sacrificial patterns 123a overlap both ends of one (for example, the first line spacer 121L2) of the first line spacers 121L1 and 121L2. A detailed description of a method of forming the second sacrificial patterns 123a is identical to that described with reference to FIGS. 2G and 3G and 2H and 3H.

The interval between the first line spacers 121L1 and 121L2 in the second embodiment is defined by the first width W1 (see FIG. 4A) described with reference to FIG. 2B as in the first embodiment. Accordingly, the interval between the first line spacers 121L1 and 121L2 may be greater than the width W3 of the second sacrificial patterns 123a, so the second sacrificial patterns 123a can overlap both ends of one of the first line spacers 121L1 and 121L2.

Figure 4C:
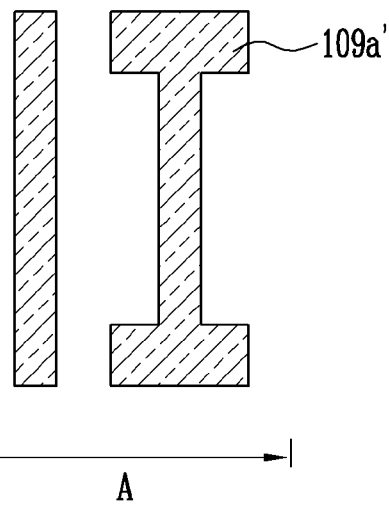

Referring to FIG. 4C, a first amorphous carbon pattern 109a' and a hard mask pattern may be formed by etching a first amorphous carbon layer and a hard mask layer using the first line spacers 121L1 and 121L2 and the second sacrificial patterns 123a as etch barriers.

Figure 4D:
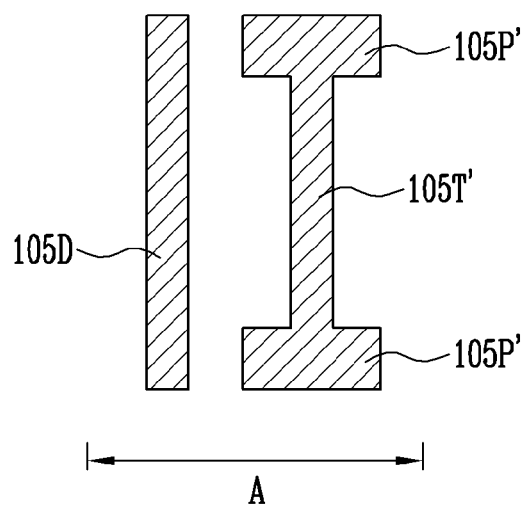

Referring to FIG. 4D, a test pattern 105T' and test pad units 105P' are formed in the first region A by etching a target etch layer using the first amorphous carbon pattern 109a' and the hard mask pattern, according to the second embodiment, as etch barriers. In the second embodiment, in addition to the test pattern 105T' and the test pad units 105P', a dummy pattern 105D not connected to the test pad units 105P' is further formed in the first region A. The dummy pattern 105D is defined by the first line spacer 121L1 not overlapping the second sacrificial pattern (refer to 123a of FIG. 4B).

As described above, even in the second embodiment, the test pad units 105P' can overlap both ends of the test pattern 105T', having a single-line form, in the first region A as in the first embodiment. Accordingly, the resistance of the cell patterns having a single-line form can be directly analyzed by measuring the resistance of the test pattern 105T' having a single-line form. Here, the target pattern formed in the first region is a resistance test pattern. Furthermore, in the second embodiment, an exposure mask for cutting can be aligned more easily because the first and second interconnection spacers placed on the same line are etched.

FIGS. 5A to 5G are plan views showing a method of forming patterns of a semiconductor device according to a third embodiment. The third embodiment shown in FIGS. 5A to 5G is identical to the first embodiment shown in FIGS. 2A to 2J except for the shape of a test pattern formed in a first region A'. Accordingly, a second region where cell patterns are formed is not shown in FIGS. 5A to 5G. In addition, in the third embodiment, the test pattern and test pad units formed in the first region are formed using the same stack structure as that shown in FIGS. 3A to 3J. Accordingly, sectional views showing the stack structure are not shown, and a description of the stack structure is omitted.

Figure 5A:
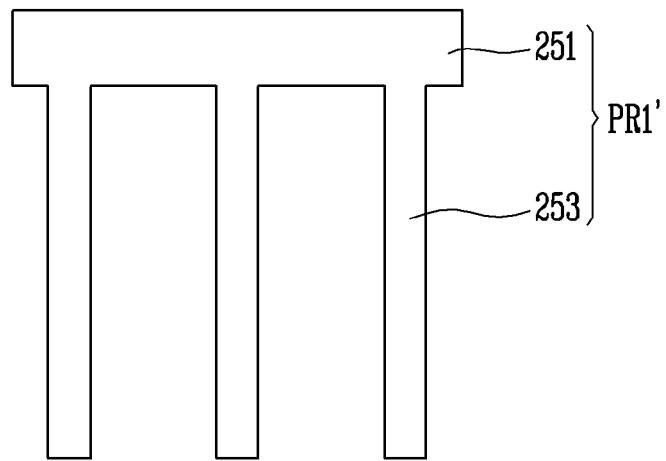
FIGS. 5A to 5G are plan views showing a method of forming patterns of a semiconductor device (top layer) according to third embodiment.

Referring to FIG. 5A, a target etch layer, a hard mask layer, a first auxiliary layer, and first photoresist patterns PR1' are formed over a semiconductor substrate. The stack structure stacked over the semiconductor substrate is identical to that shown in FIG. 3A, and a detailed description thereof is omitted. The third embodiment is identical to the first embodiment of FIG. 2A except for the shape of the first photoresist pattern PR1' formed in the first region A', and a description thereof is omitted.

In detail, the first photoresist pattern PR1' formed in the first region A' includes a first photo pattern 251 and second photo patterns 253, which are configured to protrude from one side of the first photo pattern 251 and are formed in parallel.

The width of the first photo pattern 251 is a factor to determine the alignment margin of an exposure mask for cutting. Accordingly, in the third embodiment, the width of the first photo pattern 251 has to be formed to secure the alignment margin of the exposure mask for cutting in a subsequent process. In more detail, the width of the first photo pattern 251 may be wider than the width of each of the first photoresist patterns (refer to PR1 of FIG. 2A) formed in the second region (refer to B of FIG. 2A). Although the width of the first photo pattern 251 may vary depending on the design rule of a semiconductor device, the width of the first photo pattern 251 is six to eight times the width of the first photoresist patterns (refer to PR1 of FIG. 2A) formed in the second region (refer to B of FIG. 2A) with DOF margin and the range of the first region A' taken into consideration.

Each of the second photo patterns 253 may have the same density and width as the first photoresist patterns (refer to PR1 of FIG. 2A) formed in the second region (refer to B of FIG. 2A). In this case, the second photo patterns 253 have a width narrower than that of the first photo pattern 251.

Meanwhile, to improve interference between conduction patterns to be finally formed in the first region A', the second photo patterns 253 may have a width wider than that of the first photoresist pattern (refer to PR1 of FIG. 2A) formed in the second region (refer to B of FIG. 2A). In this case, the second photo patterns 253 may have the same width as the first photo pattern 251.

Figure 5B:
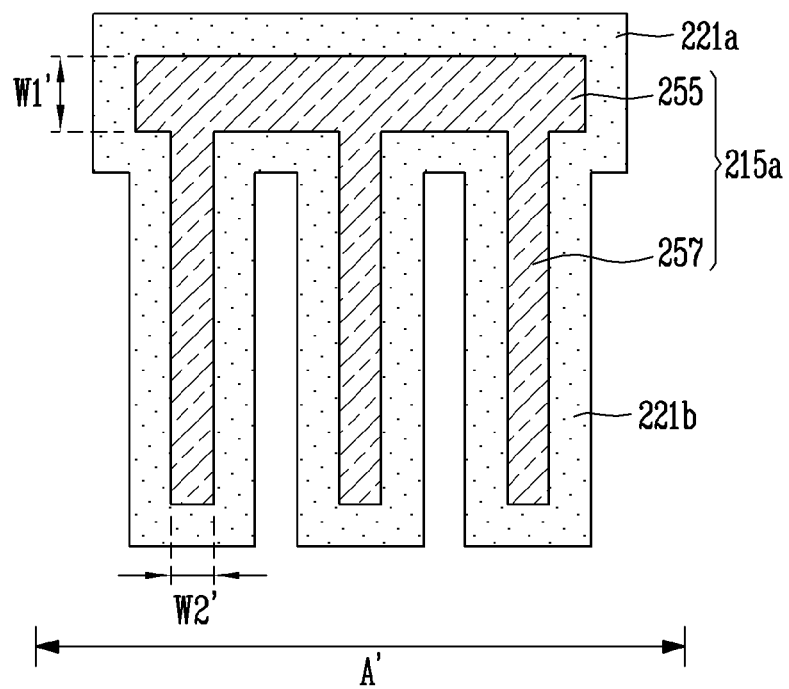

Referring to FIG. 5B, a first sacrificial pattern 215a is formed using the first photoresist pattern PR1', shown in FIG. 5A, as an etch barrier. A description of an etch process of forming the first sacrificial pattern 215a is identical to that described with reference to FIGS. 2B and 3B. That is, the third embodiment is identical to the first embodiment shown in FIGS. 2B and 3B except for the shape of the first sacrificial pattern 215a formed in the first region A'.

The shape of the first sacrificial pattern 215a formed in the first region A' is defined by the shape of the first photoresist pattern PR1' described with reference to FIG. 5A. Accordingly, the first sacrificial pattern 215a includes a first pattern 255 having a first width W1' and second patterns 257 having a third width W2'. The second patterns 257 are configured to protrude from one side of the first pattern 255 and are formed in parallel. Here, the first width W1' is defined by the width of the first photo pattern 251 described with reference to FIG. 5A, and the third width W2' is defined by the width of each of the second photo patterns 253. Accordingly, the first width W1' is wider than the second width (refer to W2 of FIG. 2B) of each of the cell sacrificial patterns (refer to 115a' of FIG. 2B). The first width W1' may be six to eight times the second width (refer to W2 of FIG. 2B). Furthermore, the third width W2' may equal the second width (refer to W2 of FIG. 2B) formed in the second region (refer to B of FIG. 2B). In this case, the third width W2' is narrower than the first width W1'. Alternatively, the third width W2' may be wider than the second width (refer to W2 of FIG. 2B) of the cell sacrificial patternpatterns formed in the second region (refer to B of FIG. 2B). In this case, the third width W2' may equal the first width W1'.

After the first sacrificial pattern 215a is formed, a first spacer configured to surround the sidewalls of the first sacrificial pattern 215a is formed. The first spacer includes a first part 221a and second parts 221b. The first part 221a is formed on a side of the first pattern 255 opposite to the second patterns 257. The second parts 221b are connected to the first part 221*a* and are configured to surround the sidewalls of the remaining first sacrificial pattern 215*a*. The first spacer, formed in the first region A' in the second embodiment, is formed using the same method as that of the first embodiment described with reference to FIGS. 2C and 3C except for its shape, and a detailed description thereof is omitted.

Figure 5C:
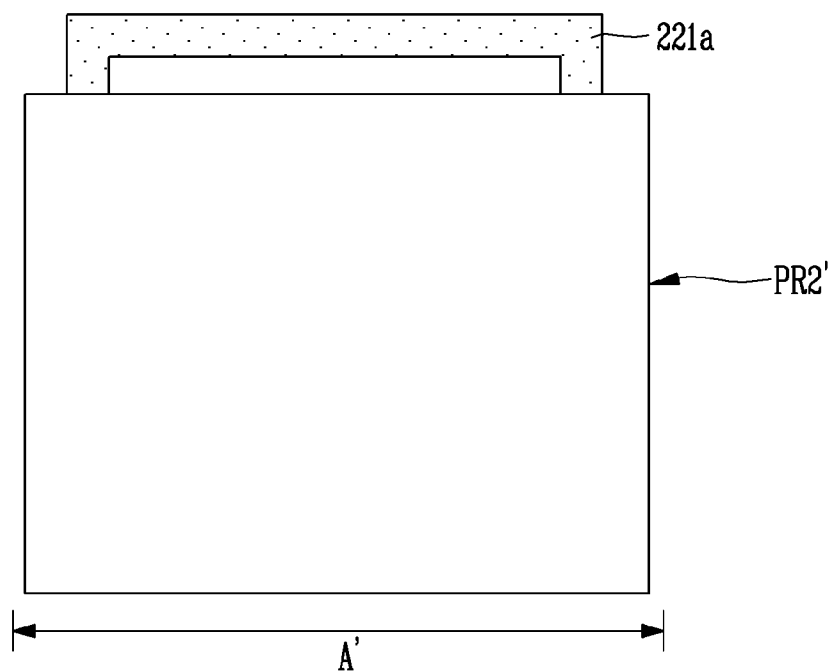

Referring to FIG. 5C, the first sacrificial pattern 215*a*, shown in FIG. 5B, is removed.

Next, a second photoresist pattern PR2' for removing the first part 221*a* of the first spacer is removed. The second photoresist pattern PR2' shown in FIG. 5C differs in shape from the second photoresist pattern PR2 according to the first embodiment, but is formed using the same method as that of the first embodiment described with reference to FIGS. 2E and 3E.

The second photoresist pattern PR2' is formed to shield the second parts 221*b* of the first spacer, but to expose the first part 221*a* of the first spacer. In the third embodiment, the interval between the first part 221*a* and the second parts 221*b*, facing the first part 221*a*, is determined by the width of the first pattern 255 described with reference to FIG. 5B. As described with reference to FIG. 5B, the width W1' of the first pattern 255 is wider than the second width (refer to W2 of FIG. 2B) of the cell sacrificial patternpatterns (refer to 115*a*' of FIG. 2B), so the alignment margin of an exposure mask for cutting for forming the second photoresist pattern PR' can be easily secured.

Figure 5D:
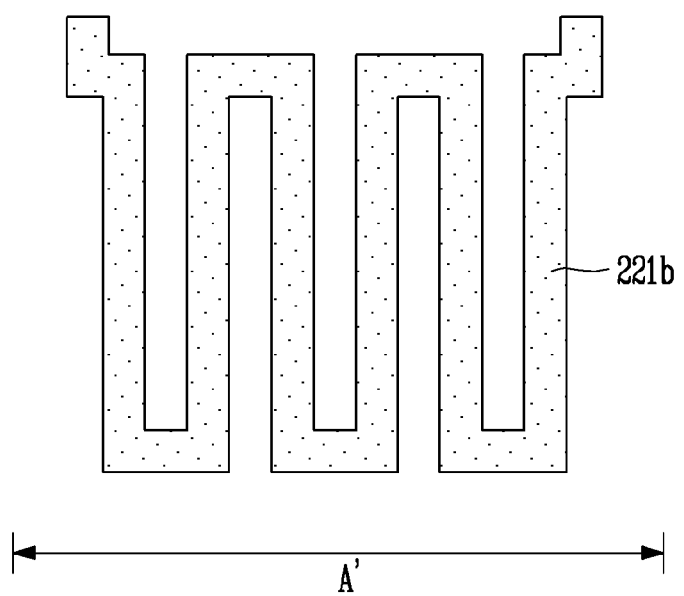

Referring to FIG. 5D, the exposed first part 221*a* of the first spacer is removed using the second photoresist pattern PR2', shown in FIG. 5C, as an etch barrier. Consequently, only the second parts 221*b* of the first spacer remain. That is, the first spacer has a single-line form in zigzags.

Figure 5E:
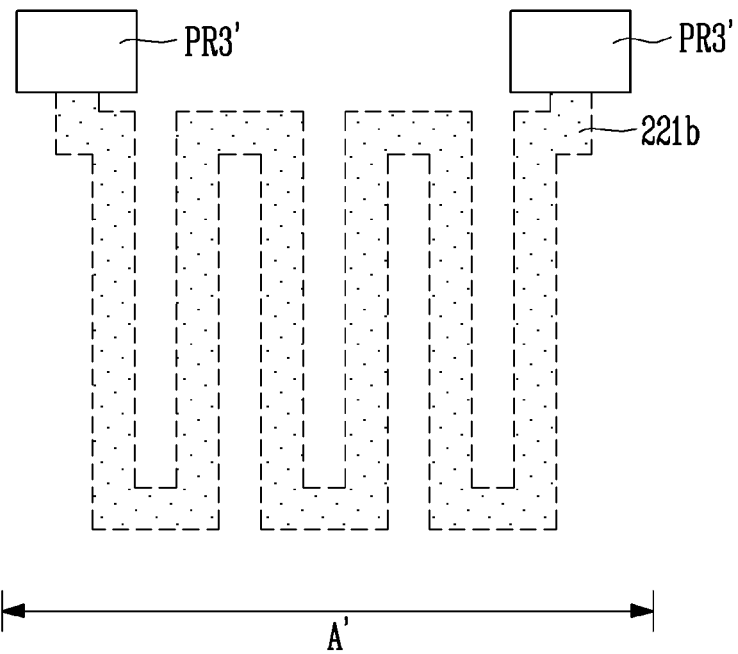

Referring to FIG. 5E, third photoresist patterns PR3' overlap with both ends of the second spacer 221*b* remaining in the first region A'. A method of forming the third photoresist patterns PR3' is identical to that described with reference to FIGS. 2G and 3G, and a description thereof is omitted.

Figure 5F:
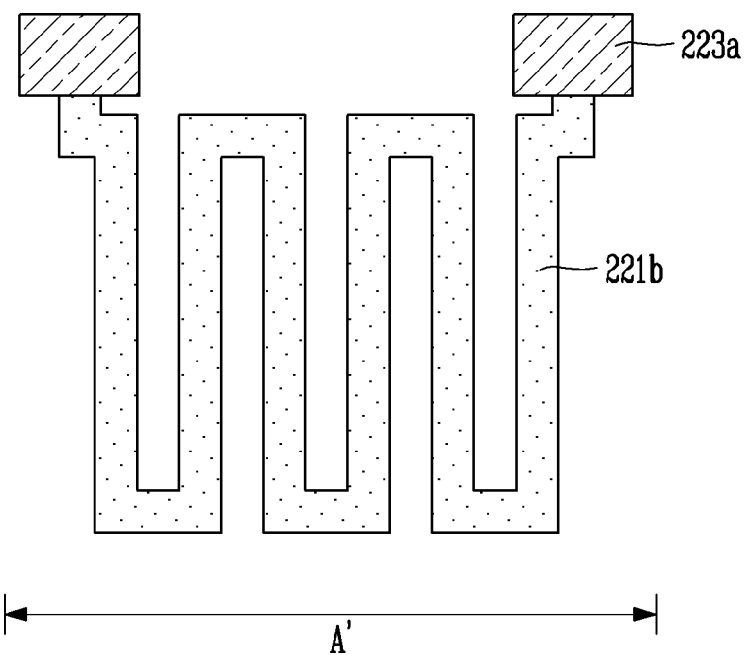

Referring to FIG. 5F, the layers under the third photoresist patterns PR3' are sequentially etched using the third photoresist patterns PR3', shown in FIG. 5E, as etch barriers. Consequently, second sacrificial patterns 223*a* overlapping both ends of the remaining second spacer 221*b* are formed. A description of the etched layers is identical to that described with reference to FIGS. 2H and 3H.

Figure 5G:
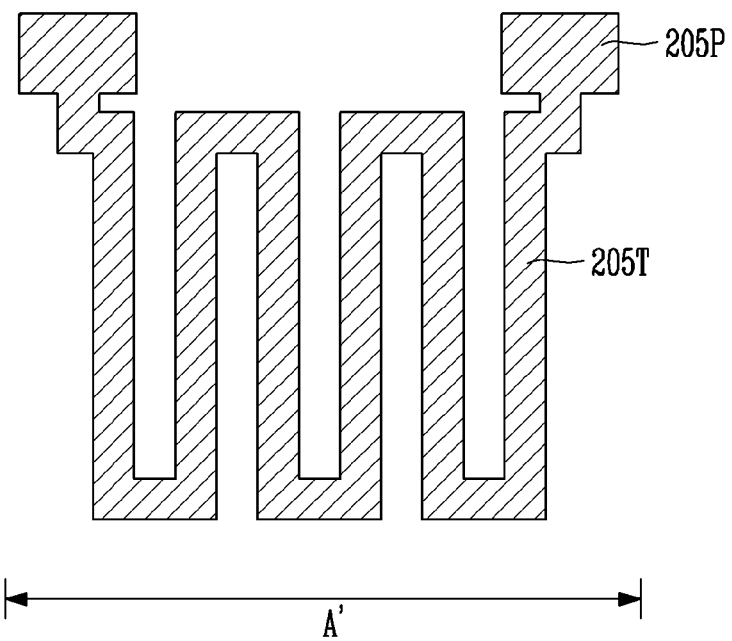

Referring to FIG. 5G, a hard mask pattern is formed by sequentially etching the underlying layers using the second sacrificial patterns 223*a* and the remaining second spacer 221*b*, described with reference to FIG. 5F, as etch barriers. The target etch layer is etched using the hard mask pattern as an etch barrier. Consequently, a test pattern 205T and test pad units 205P are formed in the first region A' of the semiconductor substrate. A description of the etched layers is identical to that of FIGS. 2I and 3I and FIGS. 2J and 3J.

The test pattern 205T is formed to have a single-line form in zigzags in the first region A' according to the third embodiment. Accordingly, the resistance of the cell patterns each having a single-line form can be analyzed without additional conversion by applying an electrical signal to the test pad units 205P and then measuring the resistance of the test pattern 205T. Here, the target pattern formed in the first region is a resistance test pattern. Furthermore, in the third embodiment, although the test pattern 205T is formed in the first region A' narrower than the second region where the cell patterns are formed, the test pattern 205T may have the same length as that of each of the cell patterns because the test pattern 205T is bent. The reason why the test pattern 205T can be formed in zigzags in single-line form is that, as described with reference to FIG. 5B, the first width W1' is wider than the width of the cell sacrificial patternpatterns, thereby being capable of securing the alignment margin of the exposure mask for cutting.

Figure 6A:
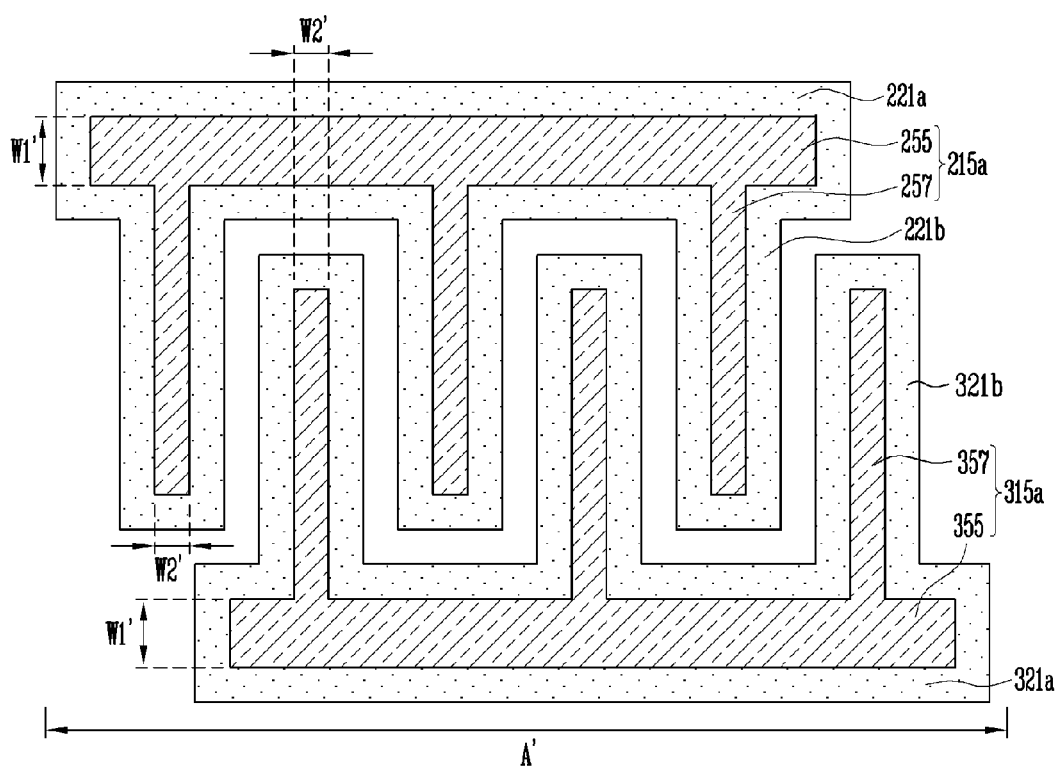
FIGS. 6A to 6C are plan views showing a method of forming patterns of a semiconductor device (top layer) according to fourth embodiment.
Figure 6B:
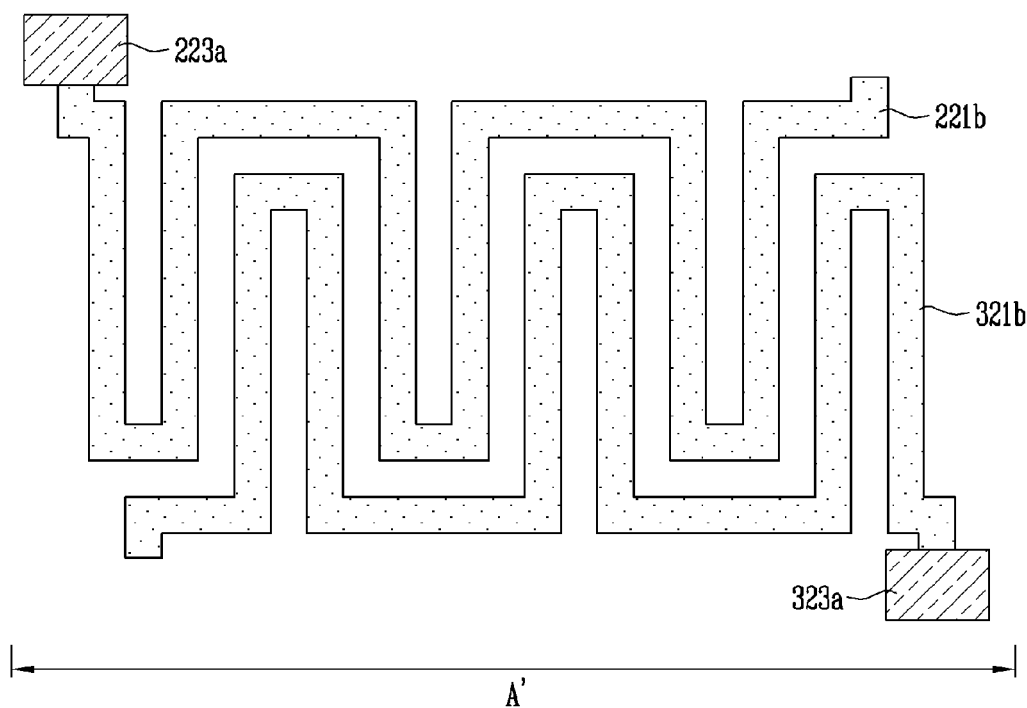
Figure 6C:
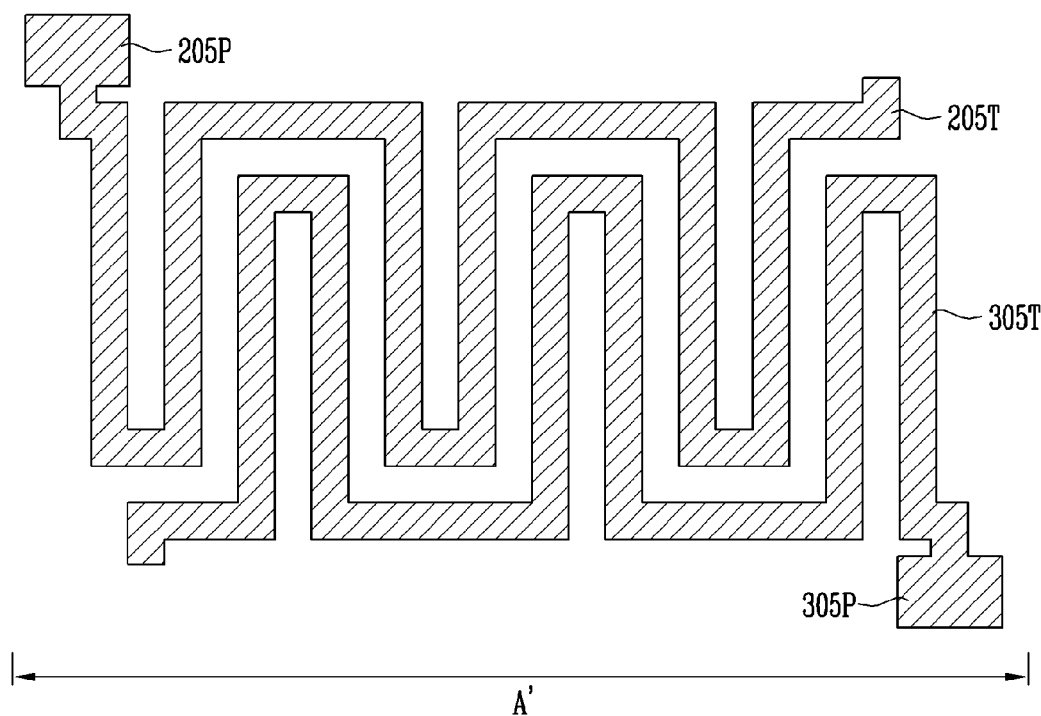

FIGS. 6A to 6C are plan views showing a method of forming patterns of a semiconductor device according to a fourth embodiment. The fourth embodiment of FIGS. 6A to 6C is identical to the first to third embodiments with respect to the description of the second region and the detailed description of an etch method and a deposition layer, but differs from the first to third embodiments in that that a test pattern having a different shape is formed in the first region. The fourth embodiment is hereinafter described while being compared with the structure formed in the first region of the third embodiment.

Referring to FIG. 6A, a first sacrificial pattern 215*a* is formed in a first region A', as described with reference to FIG. 5B. In the fourth embodiment, a third sacrificial pattern 315*a*, including a third pattern 355 and fourth patterns 357, and a first sacrificial pattern 215*a* are formed at the same time. The third pattern 355 faces the first pattern 255 with the second patterns 257 intervening therebetween. The fourth patterns 357 are configured to protrude from one side of the third pattern 355 and are placed between the second patterns 257. The third pattern 355 has a first width W1' in the same manner as the first pattern 255, and each of the fourth patterns 357 has a third width W2' in the same manner as each of the second patterns 257.

Next, a first spacer to surround the sidewalls of the first sacrificial pattern 215*a* is formed and, at the same time, a third spacer to surround the sidewalls of the third sacrificial pattern 315*a* is formed. The third spacer includes a first part 321*a* and second parts 321*b* in the same manner as the first spacer. The first part 321*a* is formed on a side of the third pattern 355 opposite to the fourth patterns 357. The second parts 321*b* are connected to the first part 321*a* and are configured to surround the sidewalls of the remaining third sacrificial pattern 315*a*.

Referring to FIG. 6B, the first sacrificial pattern 215*a* and the third sacrificial pattern 315*a* shown in FIG. 6A are removed.

The first parts 221*a* and 321*a* of the first and third spacers are then removed. The first width W1' of each of the first parts 221*a* and 321*a* of the first and third spacers is wider than that of each of the cell sacrificial patterns. Accordingly, the first parts 221*a* and 321*a* of the first and third spacers can be easily removed because process margin is sufficient.

Next, a second sacrificial pattern 223*a* is formed overlapping one end of the second spacer 221*b* having a single-line form in zigzags. At the same time, a fourth sacrificial pattern 323*a* is formed overlapping one end of the third spacer 321*b* having a single-line form in zigzags.

Referring to FIG. 6C, a hard mask pattern is formed by sequentially etching the underlying layers using the second and fourth sacrificial patterns 223*a* and 323*a* and the remaining second and third spacers 221*b* and 321*b*, described with reference to FIG. 6B, as etch barriers. The target etch layer is etched using the hard mask pattern as an etch barrier. Accordingly, first and second test patterns 205T and 305T and first and second test pad units 205P and 305P are formed in the first region A' of the semiconductor substrate.

An interval between the first and second test patterns 205T and 305T is same as an interval of cell patterns. Accordingly, in the case where a bridge is generated between the first and second test patterns 205T and 305T, current flows between the first and second test pad units 205P and 305P. That is, the first and second test patterns 205T and 305T, according to the fourth embodiment, may be used as bridge patterns for determining whether bridge has occurred between the cell patterns during a process. Here, the target pattern formed in the first region is a bridge pattern.

The interval between the spacer to be etched and the spacer not to be etched in the region where the test pattern is formed is wide, thereby being capable of securing the alignment margin of an exposure mask for cutting. Accordingly, the test pattern having a single-line form can be stably formed.

The shape or width of the sacrificial pattern, defining the region where the spacer is formed, differs in the region where the cell patterns are formed and the region where the test pattern is formed. Accordingly, test patterns having various forms can be formed.

Test patterns having various forms can be formed by changing the shape or width of the photoresist pattern. Accordingly, the manufacturing cost of semiconductor devices can be reduced because an addition process of diversifying the shape of the test pattern is not required.

While the present invention has been described with respect to the specific embodiments, it will be apparent to those skilled in the art that various changes and modifications may be made without departing from the spirit and scope of the invention as defined in the following claims.

What is claimed is:

1. A method of forming patterns of a semiconductor device, the method comprising:
    forming a target etch layer and a hard mask layer over a semiconductor substrate;
    forming line spacers each having two ends and spaced apart from each other over the hard mask layer, wherein both ends of neighboring two line spacers of the line spacers are connected by interconnection spacers;
    removing one of the two line spacers;
    forming first auxiliary patterns overlapping the both ends of a remaining one of the two line spacers;
    forming a hard mask pattern by etching the hard mask layer using the remaining one of the two line spacers and the first auxiliary patterns as etch barriers; and
    forming a target pattern having a single line with two ends and pad units connecting to both ends of the target pattern by etching the target etch layer using the hard mask pattern as an etch barrier.

2. The method of claim 1, wherein forming the first auxiliary patterns comprises:
    forming a Spin On Carbon (SOC) layer over the hard mask layer including the line spacers;
    forming photoresist patterns that cover both ends of one of the line spacers over the SOC layer; and
    etching the SOC layer using the photoresist patterns as an etch barrier.

3. The method of claim 1, wherein forming the line spacers comprises:
    forming a first amorphous carbon layer, a first SiON layer, a polysilicon layer, a second amorphous carbon layer, and a second SiON layer over the hard mask layer;
    forming a photoresist pattern over the second SiON layer etching the second SiON layer and the second amorphous carbon layer using the photoresist pattas an etch barrier to form a second auxiliary pattern over the polysilicon layer;
    forming a spacer layer surrounding sidewalls of the second auxiliary pattern; and
    forming the line spacers and the interconnection spacers by removing the second auxiliary pattern.

4. The method of claim 3, further comprising:
    removing the photoresist pattern and the patterned second SiON layer before forming the spacer layer.

5. The method of claim 1, further comprising:
    forming a photoresist pattern that covers a part of the line spacers and the interconnection spacers; and,
    removing a portion of each of the interconnection spacers before forming the first auxiliary patterns.

6. The method of claim 1, wherein the first auxiliary patterns overlap with each of the interconnection spacers.

7. The method of claim 1, the first auxiliary pattern is wider than the line spacer.

8. The method of claim 1, wherein the target pattern is a test pattern patterned by using one of the line spacer and the pad units are test pad units patterned by using the first auxiliary patterns.

9. The method of claim 8, wherein the test pattern and the test pad units are formed over the semiconductor substrate of a peripheral region.

10. The method of claim 1, further comprising:
    providing cell line spacers over the semiconductor substrate of a cell region while forming the line spacers over the semiconductor substrate of a peripheral region, wherein an interval between the line spacers is wider than an interval between cell line spacers.

11. A method of forming patterns of a semiconductor device including a peripheral region and a cell region, the method comprising:
    forming a conductive layer and a hard mask layer over a semiconductor substrate;
    forming a first sacrificial pattern having a first width of the peripheral region and a second sacrificial pattern having a second width of the cell region over the hard mask layer;
    forming a spacer layer surrounding sidewalls of the first and the second sacrificial patterns;
    removing the first and the second sacrificial patterns;
    removing a part of the spacer layer to form a first line spacer having two ends and interconnection spacers configured to connect both ends of the first line spacer in the peripheral region and the second line spacers in the cell region;
    forming auxiliary patterns overlapping the interconnection spacers of the peripheral region;
    forming hard mask patterns by etching the hard mask layer using the first line spacer, the interconnection spacers, the auxiliary patterns, and the second line spacers as etch barriers; and
    forming a test pattern having a single line with two ends and test pad units connected to both ends of the test pattern of the peripheral region and cell patterns of the cell region by etching the conductive layer using the hard mask patterns as an etch barrier.

12. The method of claim 11, wherein the first width is wider than the second width.

13. The method of claim 12, wherein the first width is six times to eight times wider than the second width.

14. A method of forming patterns of a semiconductor device, the method comprising:
    forming a conductive layer and a hard mask layer over a semiconductor substrate of a peripheral region;
    forming line spacers each having two ends and spaced apart from each other and interconnection spacers spaced apart from each other over the hard mask layer, wherein the interconnection spacers are configured to connect both ends of the line spacers;
    removing the interconnection spacers;
    forming auxiliary patterns overlapping both ends of one of the line spacers;

forming a hard mask pattern by etching the hard mask layer using the line spacers and the auxiliary patterns as etch barriers; and forming a test pattern having a single line with two ends and a dummy pattern isolated from the test pattern and test pad units connected to both ends of the test pattern by etching the conductive layer using the hard mask pattern as an etch barrier, wherein an interval between the test pattern and the dummy pattern of the peripheral region is wider than an interval between cell patterns of a cell region.

* * * * *